April 29, 1958 M. W. SLATE 2,832,892

TUNING DEVICE FOR ULTRA-HIGH FREQUENCY CIRCUITS

Filed Dec. 24, 1954 3 Sheets-Sheet 1

INVENTOR.
MATTHEW W. SLATE
BY Darby & Darby
ATTORNEYS

INVENTOR.
MATTHEW W. SLATE
BY Darby & Darby
ATTORNEYS

April 29, 1958 M. W. SLATE 2,832,892
TUNING DEVICE FOR ULTRA-HIGH FREQUENCY CIRCUITS
Filed Dec. 24, 1954 3 Sheets-Sheet 3
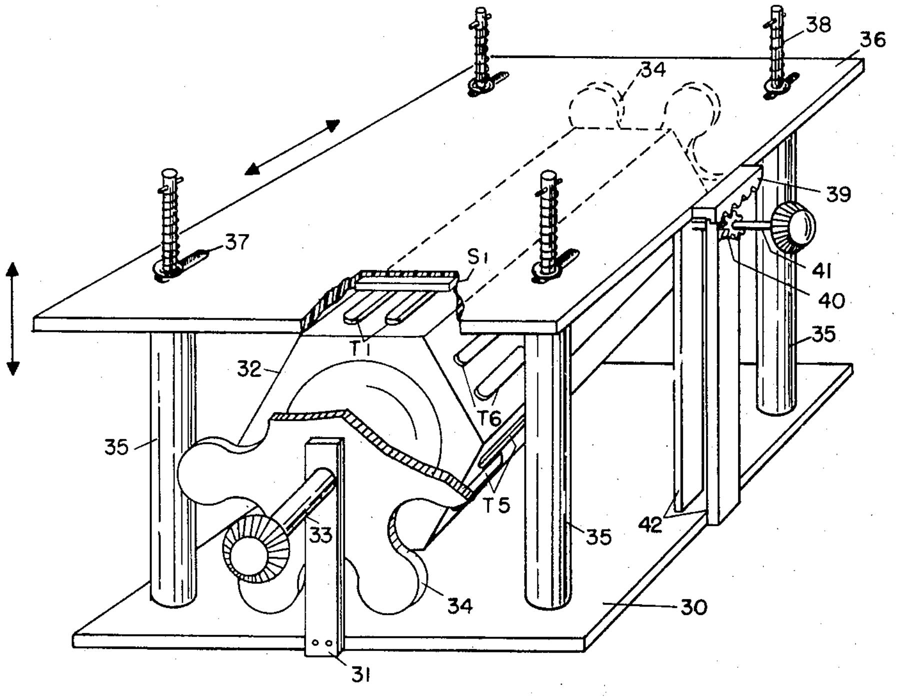
Fig. 6
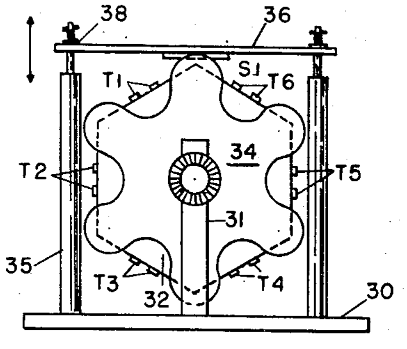
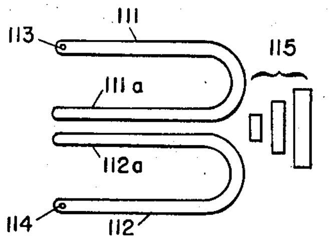
Fig. 8
Fig. 7
INVENTOR.
MATTHEW W. SLATE
BY Darby & Darby
ATTORNEYS 2,832,892

TUNING DEVICE FOR ULTRA-HIGH FREQUENCY CIRCUITS

Matthew W. Slate, New York, N. Y., assignor to Allen B. Du Mont Laboratories, Inc., Clifton, N. J., a corporation of Delaware Application December 24, 1954, Serial No. 477,473

7 Claims. (Cl. 250—40)

The present invention relates to tuning devices for circuits to be operated at ultra-high frequencies (U. H. F.) and, more particularly, involves a tuning device in which the frequency determining elements are arranged on a pair of insulating members that are movable both as a unit and one relative to the other. The members may be either planar or curved, or a combination of both. The basic tuned circuit elements are mounted on one member and the tuning or shading elements which vary the frequency of the tuned circuit are mounted on the other member.

In this application, the phrase "unshaded frequency" is used when referring to the frequency determined solely by the basic tuned circuit elements i. e., when there are no shading element or elements present. Shading elements, in this invention, are moved relative to the circuit elements to tune the circuit both above and below its "unshaded frequency" in order to cover a wide, continuous tuning range.

The present invention represents an improvement on the copending application of David C. Felt, Serial No. 314,851, filed October 15, 1952, which issued as Patent No. 2,807,724, on September 24, 1957, and is a continuation-in-part of my copending application, Serial No. 400,900, filed December 29, 1953, now abandoned, both being assigned to the assignee of this invention.

In the Felt application, the resonant frequency of a pair of open ended transmission line elements is decreased from its "unshaded frequency" by a capacitive shading element at the capacitive end of the line. As the shading element approaches the inductive end of the line, the inductive effect tends to oppose this variation and thereby limits the frequency range.

In the present invention, by the proper design of the circuit tuning elements, the capacitive and inductive effects are essentially separated. The inductive effect may then be employed to tune the circuit above its "unshaded frequency," thus considerably extending the tuning range instead of reducing it.

An important object of my invention therefore, is to provide a tuning device having shading elements capable of tuning its associated circuit both above and below its "unshaded frequencies,' 'thereby obtaining a wide, continuous range of tuning.

Another important object of my invention is to provide a tuning device having circuit elements comprising transmission line pairs and a shading element or elements arranged to cooperate therewith to produce continuous tuning over a wide range.

A further object of my invention is to provide for the above general objects in devices of various physical forms, examples of which are herein disclosed.

A still further object of my invention is to provide tuning mechanisms of the above type in physical forms whereby the above tuning objectives may be applied selectively to a plurality of different frequency bands.

A more specific object of my invention is to provide a tuning device of the type herein described for use in connection with printed circuits or circuit parts and wherein, more particularly, the transmission line pairs are of a significant part of a wavelength.

Many other and more detailed objects of my invention will be apparent from the following description of the several embodiments thereof illustrated in the attached drawings.

In the accompanying drawings—

Fig. 6 is a perspective view of a modified form of my invention with some parts broken away for clarity.

Fig. 7 is an elevation view of the front end of Fig. 6.

Fig. 8 is a diagrammatic view of a modified form of my novel transmission line pair and the shading element therefor.

Figure 1:
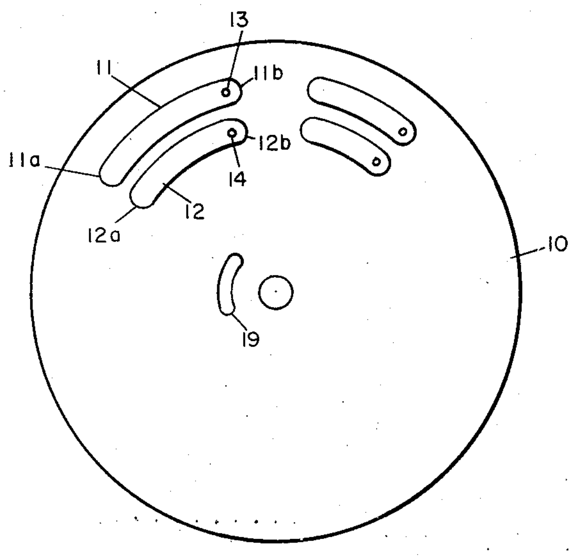
Fig. 1 is a top plan view, in somewhat diagrammatic form, illustrating the mounting arrangement of several transmission line pairs on one face of an insulative member, in this case in the form of a disk.

Referring now to Fig. 1 of the drawings, there is shown an insulative member 10, in this case in the form of a disk, having mounted thereon two transmission line pairs 9 and 9*a*. These lines are generally similar in form and have an effective length in the vicinity of one-quarter wavelength at the operating range of the circuits to which they are connected. One of the pairs will be described as exemplary of the two shown and the many additional pairs which could be used for a multiband tuning device.

Figure 5:
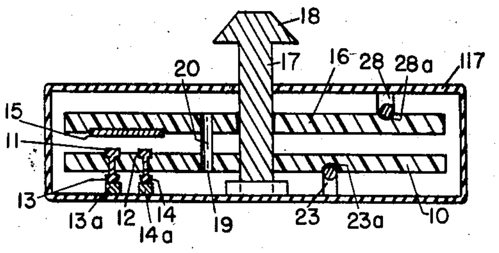
Fig. 5 is a cross-sectional view of my invention taken on line 5—5 of Fig. 4.

Transmission line pair 9 is comprised of conductors 11 and 12 and are shown in Fig. 1 as having an arcuate planar form. Conductors 11 and 12 are also provided with circuit terminals in the form of rivets 13 and 14, which rivets pass through the conductors and the mounting member and, as shown in greater detail in Fig. 5, are exposed in the form of contacts at the back of the mounting member.

A characteristic of open-ended transmission lines having a length in the vicinity of one-quarter wavelength or less at the operating range of the circuit to which they are connected, is a voltage maximum and the current minimum at the open circuit end 11*a*—12*a* of conductors 11 and 12, and a current maximum and voltage minimum at ends 11*b*—12*b*.

The following discussion applies to transmission lines having effective lengths of one-quarter wavelength or less, but it should be understood that the above mentioned phenomenon of a voltage minimum and current maximum takes place at the one-quarter wavelength point when the transmission line is greater than the one-quarter wavelength.

When a small amount of capacitance is added at the open circuit end of such a transmission line, viz, end 11*a*—12*a*, the line is effectively lengthened. Thus, the resonant frequency of the circuit, which includes conductors 11 and 12, is effectively decreased. Reducing inductance at the open circuit end will cause no appreciable frequency effect. However when inductance is taken away or subtracted at one-quarter wavelength distance from the open circuit end, viz, end 11*b*—12*b* of conductors 11 and 12, the line is effectively shortened.

Thus, the resonant frequency of the circuit which includes conductors 11 and 12 is effectively increased. Added capacitance at the *11b*—*12b* end will not cause any appreciable effect.

Returning now to the drawings—

Figure 2:
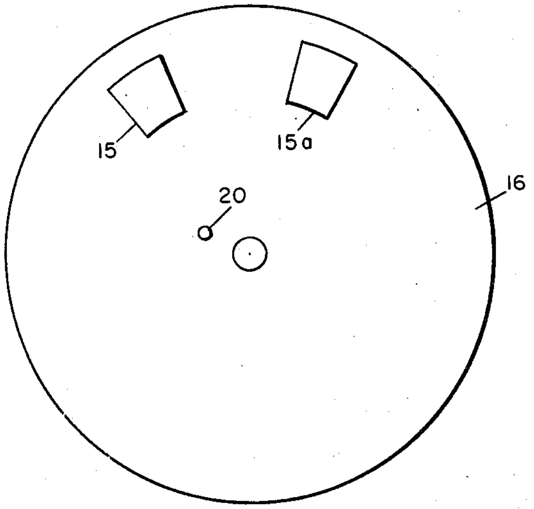
Fig. 2 is a plan view of an insulative member similar to the member of Fig. 1, and illustrating the mounting arrangement of the respective shading elements for the transmission line pairs of Fig. 1.

In Fig. 2, a second insulative member 16, also in the form of a disk, is shown provided with a plurality of planar, conductive, shading elements 15 and **15*a*. Either shading element might be used to tune a plurality of transmission line pairs, but for practical applications, especially when used in television receivers, one shading element is provided for each transmission line pair. The shading elements are preferably so dimensioned in length as to overlie approximately one-quarter to one-half of the length of conductors 11 and 12** of Fig. 1, and preferably extend somewhat beyond them at each side in a radial direction.

When for example, shading element 15 is placed over a portion of conductors 11 and 12, it will increase the capacitance of the covered portion of the line and decrease the inductance by virtue of the current induced in the shading element. As will be made clear later, elements 15 and **15*a*** are positionable in close proximity to but not in contact with the conductors of Fig. 1.

When shading element 15 is at end *11a*—*12a* of conductors 11 and 12 of Fig. 1, the voltage is at a maximum and the current is at a minimum. The effect of shunt capacitance is large and the effect of series inductance is small. The result of an increase in capacitance will therefore predominate and the frequency will be decreased below its unshaded value.

Conversely, in the vicinity of a point one-quarter wavelength from the open circuit end of the line, i. e. end *11b*—*12b* of conductors 11 and 12 of Fig. 1, the voltage is at a minimum and the current is at a maximum. Therefore, the effect of shunt capacitance is small and the effect of series inductance is large. In this position, a decrease in inductance in the line will predominate and the frequency will be increased above its unshaded value.

At some intermediate point the two effects will be of equal importance and the frequency of operation of the circuit will be the same as though it were unshaded.

The above considerations represent phenomena which are peculiar characteristics of transmission line pairs having a length which is a significant part of the wavelength at the operating range of the circuits to which they are connected.

From the above description it will be apparent that any arcuate movement of shading element 15 along the arcuate center line of a transmission line pair will vary the frequency both above and below the unshaded frequency, i. e., the frequency at the intermediate point, and thus provide a wide, continuous range.

Figure 3:
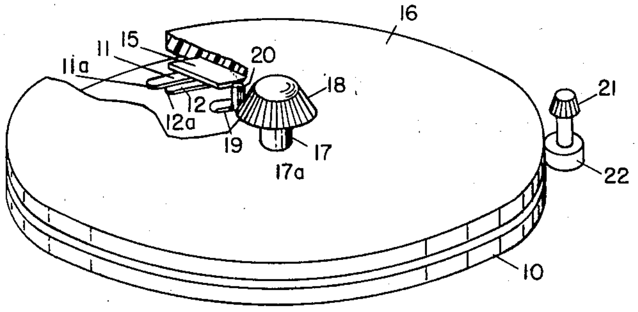
Fig. 3 is a perspective view in somewhat diagrammatic form, with some parts broken away, showing the cooperative relationship of the structures of Figs. 1 and 2.

Fig. 3 shows, somewhat in diagrammatic form, a structure by means of which member 10 of Fig. 1 and member 16 of Fig. 2 can be associated for relative rotational and for conjoint movement, with the shading element 15 moving in a plane in close proximity to the plane of the transmission line pair conductors 11 and 12, but not in contact therewith.

These functions are provided by means of shaft 17 which is secured at its lower end (not shown) in member 10 and passes frictionally through opening **17*a* in the disk 16 and is provided, on its free end, with knob 18. Knob 18 turns shaft 17 and disk 10, and by reason of the frictional engagement of that shaft with the disk 16, it, too, will turn in unison with the disk 10**. This movement in unison will be used as explained hereinafter in connection with channel selection.

In order to tune each circuit or channel connected with the respective transmission line pairs, means is provided for effecting independent rotation of disk 16 with regard to disk 10. This is accomplished by means of a friction roller 22 engaging the periphery of disk 16 and provided with an operating shaft and knob 21. The parts are proportioned to provide a sort of vernier action so that each shading element 15 can be oscillated about the arcuate center of the elements 11 and 12 to tune the circuit connected to conductors 11 and 12 over the wide range previously discussed.

As a matter of practical convenience, it is desirable to limit the relative movement of members 10 and 16 for fine tuning and this is accomplished by providing an arcuate slot 19 in member 10. Pin 20, secured to member 16, projects into slot 19. Since the arcuate length of the transmission line pairs may vary somewhat, it is desirable that slot 19 have a length approximately equal to the length of the longest transmission line pair. Thus, the relative motion of member 16 with regard to member 10 will be limited by the engagement of pin 20 at one or the other end of slot 19. Since the length of slot 19 may permit a larger arcuate travel of shading elements 15, **15*a***, over some transmission line pairs of shorter length, it is desirable to separate the transmission line pairs a sufficient circumferential distance so that any possible over-travel of the shading elements with respect to the shorter transmission line pairs will not cause the shading elements to influence adjacent transmission line pairs (see Fig. 1). Thus, any small amount of over-travel with regard to shorter length transmission line pairs will not affect the tuning of the circuits connected to the shorter transmission line pair.

Figure 4:
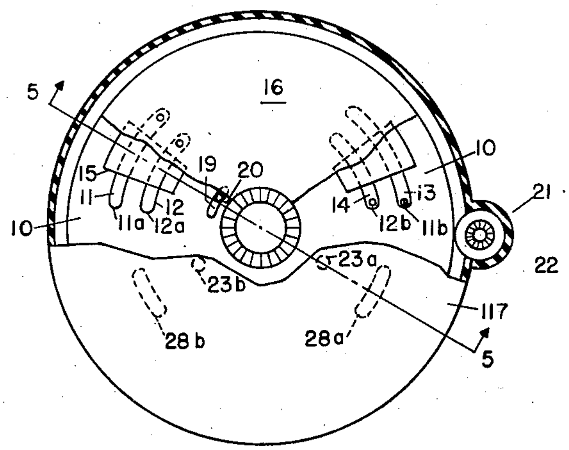
Fig. 4 is a top plan view of the structure of Fig. 3 showing my invention mounted in a suitable housing with the cover of said housing partly broken away and with parts of the shading element member broken away.

Figs. 4 and 5 show in a more complete assembly, the embodiment of the structure previously described, wherein the members are enclosed within a housing 117 of suitable configuration. One end of shaft 17 is shown in Fig. 5 mounted in a bearing on the housing. These figures also illustrate circuit terminals 13ᵃ and 14ᵃ for a particular channel positioned to be engaged by the contact ends of the rivets 13 and 14.

As a further desirable adjunct, indexing devices are provided to insure indexing of the two members when moving as a unit into proper position for circuit selection, that is, for engagement of rivets 13 and 14 with the respective circuit terminals, such as 13ᵃ and 14ᵃ. The indexing of the members as a unit is accomplished by means of spring loaded ball detent 23 which engages radially aligned depressions 23ᵃ and 23ᵇ. Similarly, for independent movement of disk 16, a ball detent 28 is provided which cooperates with depressions 28ᵃ and 28ᵇ in the disk 16 so as to centrally index the respective shading elements with the arcuate centers of the transmission line pairs. These are but some of the possible refinements which may be used with structures of this kind and which would include suitable dial indicators in application, for example, to television receivers.

The first and second insulative members 10 and 16 of the previously described structure can have many other physical forms. In addition to both being planar members, one may be planar and the other of circular or polygonal cross-section, a form illustrated in Figs. 6 and 7, or either or both may be of circular cross-section, that is, of tubular form, one nested within the other.

The structure illustrated in Figs. 6 and 7 includes a suitable base 30, having a pair of standards 31 at opposite ends, on which is journalled a first insulative support 32 of polygonal cross-section by means of knobbed shaft 33. Mounted on each planar surface of drum 32 are a series of transmission line pairs T–1 to T–6, inclusive. Also mounted on shaft 33, adjacent each end of support 32 is a cam 34 having a lobe for each corner of the polygonal drum. These cams are secured to shaft 33 with the lobes positioned in alignment with the corners of the polygonal ends of drum 32, as shown in Fig. 7. Mounted on base 30 are four standards 35 having free ends of reduced diameter that project through slots 37 in the second insulative support 36. The shoulders of standards 35 are positioned so that shading elements S–1, mounted on the underface of the support 36, will be in close proximity to the transmission line pairs, as illustrated in Fig. 6. Support 36 is held against the shoulders by compression springs 38. Secured to the edge of support 36 is toothed rack 39 cooperating with pinion 40, mounted on knobbed shaft 41, rotatably supported in standards 42.

Any pair of transmission line conductors T–1 to T–6 can be brought in close proximity to shading element S–1 by rotating shaft 33. Cam 34 is positioned to raise support 36 so that the high corners of the drum can clear it, as illustrated in Fig. 7. When a plane side of the drum is parallel to support 36, springs 38 will hold that support in operative position. This arrangement may include means for band selection, as will be apparent to one skilled in the art, and it will be understood that indexing means can be provided to insure proper parallelism between the drum sides respectively and the support 36.

The fine tuning of each band connected with the respective elements T–1 to T–6 is accomplished by rotating shaft 41, which causes the plate 36 to move in a plane longitudinally of the drum so that the shading element can be moved from one end to the other of the transmission line pairs. The slots 37 can be designed to perform a motion limiting function corresponding to the slot 19 of Fig. 4.

It will be obvious to those skilled in the art how the necessary circuit connections can be made with the transmission line pairs for each band in a structure of this form; the main purpose of the illustrations of Figs. 6 and 7 is to demonstrate that the insulative members do not both have to be planar.

There is diagrammatically illustrated in Fig. 8 a modification of the elements of the tuning device which impart other frequency tuning characteristics. In this case the transmission line pairs 111 and 112 are U-shaped, the overall length of the pairs being in the vicinity of a one-quarter wavelength. They are positioned so that the open circuit ends 111$^{a}$ and 112$^{a}$ are the active ends with respect to the shading element assembly 115. As in the case of the structure of Fig. 1, contact rivets 113 and 114 are provided at the circuit connection ends. In this arrangement the shading element is shown as comprising a plurality of metal plates of gradually increasing size. They are shown as assembly 115. It is, of course, apparent that the transmission line pair 111—112 and the shading element assembly 115 will be mounted on relatively movable insulative supports, several forms of which have been previously discussed herein, and supplied with the other adjuncts described, such as providing a plurality of transmission lines, shading element units, contact members for channel selection, means for limiting relative movement in tuning, means for providing conjoint movement for channel selection, indexing detents, and the like.

As will be understood by those skilled in the art, each shading element of assembly 115, in moving towards the left from the position shown, will approach the transmission line in the vicinity of one-eighth wavelength from a voltage maximum and move over the transmission line towards the voltage maximum which is at the end 111$^{a}$—112$^{a}$. Thus, as each shading element moves from some voltage towards a maximum, while the capacitance will be constant, for a given area of overlap, the effect of the capacitance increases causing the resonant frequency to decrease.

It is, of course, understood that this phenomena will only occur when the operating frequencies are high enough so that the circuit elements can be considered to act as a transmission line and in which case the length of the line is a significant part of a wavelength. By using shading elements of increasing area, the capacitance will increase as the shading elements 115 move over the active ends of the transmission line to cause a total capacitance increase and, thus, a correspondingly greater decrease in resonant frequency. Thus, a wider tuning range is possible by using a plurality of shading elements of increasing area in association with the same transmission line.

From the above description it will be apparent to those skilled in the art that the subject matter of this invention is capable of considerable variation in physical form with resultant variation in electrical characteristics. The examples of the invention as herein given provide some suggestion of this range, but are not to be considered in a limiting sense.

What is claimed is:

1. In a tuning device of the type having a circuit disk bearing a plurality of groups of circuit tuning elements selectively connectable in an external circuit and a tuning disk coaxially mounted with respect to said circuit disk and bearing a corresponding plurality of groups of shading elements the tuning disk being oscillatable with respect to the circuit disk, the improvement which comprises providing tuning elements on said circuit disk comprising transmission lines of one-quarter the wavelength of the respective center frequencies to be tuned by a particular tuning element and providing shading elements on the face of the tuning disk facing said tuning elements, said shading elements comprising generally rectangular conductive plates extending radially of said tuning disk and of a length to transversely overlie the associated transmission line, each said shading element when positioned in alignment with the transverse center line of said associated transmission line being ineffective to modify the tuning, said shading elements increasing the tuned frequency when oscillated toward a position overlying one end of the transmission line and decreasing the tuned frequency when oscillated in the opposite direction.

2. A device as claimed in claim 1, characterized in that each said transmission line is composed of a pair of arcuate conductive elements, said elements being arranged on concentric circles and spaced apart radially, said elements of a pair occupying the same angle of arc.

3. A device as claimed in claim 1, characterized in that connections are made from corresponding ends of the elements of a transmission line pair to an external circuit.

4. A device as claimed in claim 1, characterized in that said tuning disk is oscillatable relative to said circuit disk, said oscillation being limited to the angle of arc occupied by said transmission line pair.

5. A device as claimed in claim 1, characterized in that transmission line pairs and associated elements are arranged in groups, said groups of transmission line elements being simultaneously and selectively connectable in external tunable circuits whereby rotation of the circuit disk tunes to selected frequency bands and oscillation of the tuning disk relative to the circuit disk tunes to selected frequencies within the band, said tuning being continuous and over a wide range.

6. In a high frequency band selector and tuning device, the combination comprising first and second insulative members, a plurality of conductive transmission line pairs mounted on said first member and connected to a utilization circuit, the length of each pair of said plurality of transmission line pairs being a significant part of the wavelength at the operating range of the circuit to which it is connected, at least one shading element mounted on said second member, means maintaining at least one pair of said plurality of transmission line pairs in close proximity to said shading element, means for moving said first member to selectively connect said line pairs to said circuit, means for moving said second member relative to said first member to cause the shading element to assume desired positions with respect to the line pair connected to said circuit and means for limiting the relative movement of said members to a distance substantially equal to the length of the longest transmission line pair.

7. In a high frequency band selector and tuning device, the combination comprising first and second insulative members, a plurality of conductive transmission line pairs mounted on said first member and connected to a utilization circuit, the length of each pair of said plurality of transmission line pairs being a significant part of the wavelength at the operating range of the circuit to which it is connected, at least one shading element mounted on said second member, means maintaining at least one pair of said plurality of transmission line pairs in close proximity to said shading element, means for moving said first member to selectively connect said line pairs to said circuit, means for moving said second member relative to said first member to cause the shading element to assume desired positions with respect to the line pair connected to said circuit and means for limiting relative movement between said members to a distance substantially equal to the length of the longest transmission line and said transmission line pairs being separated a sufficient distance so that the shading element for any band position may not electrically effect adjacent transmission line pairs.

References Cited in the file of this patent

UNITED STATES PATENTS

| | | |
|---|---|---|
| 2,246,928 | Schick | June 24, 1941 |
| 2,513,392 | Aust | July 4, 1950 |
| 2,563,299 | Acosta | Aug. 7, 1951 |
| 2,601,338 | Snyder | June 24, 1952 |
| 2,629,860 | Chesus | Feb. 24, 1953 |
| 2,773,989 | Nestlerode | Dec. 11, 1956 |
| 2,807,724 | Felt | Sept. 24, 1957 |

FOREIGN PATENTS

| | | |
|---|---|---|
| 870,011 | France | Feb. 27, 1942 |